US008705775B2

(12) United States Patent
Sheplak et al.

(10) Patent No.: US 8,705,775 B2
(45) Date of Patent: Apr. 22, 2014

(54) CAPACITIVE MICROPHONE WITH INTEGRATED CAVITY (75) Inventors: Mark Sheplak, Gainesville, FL (US); David Patrick Arnold, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 614 days.

(21) Appl. No.: 12/597,572

(22) PCT Filed: Apr. 25, 2008

(86) PCT No.: PCT/US2008/061603
§ 371 (c)(1), (2), (4) Date: Dec. 1, 2009

(87) PCT Pub. No.: WO2008/134530
PCT Pub. Date: Nov. 6, 2008

(65) Prior Publication Data
US 2010/0119088 A1 May 13, 2010

Related U.S. Application Data (60) Provisional application No. 60/926,307, filed on Apr. 25, 2007.

(51) Int. Cl.
*H04R 25/00* (2006.01)
(52) U.S. Cl.
USPC .......................................... 381/174; 381/113
(58) Field of Classification Search
USPC ........ 381/94.2, 111, 113, 174–176, 190–191, 381/355; 367/181
See application file for complete search history.

(56) References Cited

U.S. PATENT DOCUMENTS

| 4,492,825 | A | | 1/1985 | Brzezinski et al. |
| 5,452,268 | A | * | 9/1995 | Bernstein ............... 367/181 |
| 5,490,220 | A | | 2/1996 | Loeppert |
| 5,740,261 | A | | 4/1998 | Loeppert et al. |
| 5,870,482 | A | | 2/1999 | Loeppert et al. |
| 6,535,460 | B2 | | 3/2003 | Loeppert et al. |

(Continued)

FOREIGN PATENT DOCUMENTS

GB 2231235 7/1990

OTHER PUBLICATIONS

David T. Martin, Design, Fabrication Characterization of a MEMS Dual Backplate Capacitive Microphone, Ph.D. dissertation, University of Florida, Gainesville, FL, 2007.*

(Continued)

*Primary Examiner* — Davetta W Goins
*Assistant Examiner* — Phylesha Dabney
(74) *Attorney, Agent, or Firm* — Saliwanchik, Lloyd & Eisenschenk (57) ABSTRACT

A capacitive microphone and method of fabricating the same are provided. One or more holes can be formed in a first printed circuit board (PCB). A diaphragm can be surface micro-machined onto an interior surface of the first PCB at a region having the one or more holes. Interface electronics can also be interconnected to the interior surface of the PCB. One or more spacer PCBs can be attached to a second PCB to the first PCB, such that appropriate interconnections between interconnect vias are made. The second PCB and first PCB with spacers in between can be attached so as to create a cavity in which the diaphragm and interface electronics are located.

72 Claims, 6 Drawing Sheets

(56) References Cited

U.S. PATENT DOCUMENTS

| | | | |
|---|---|---|---|
| 6,552,469 | B1 | 4/2003 | Pederson et al. |
| 6,842,964 | B1 | 1/2005 | Tucker et al. |
| 6,847,090 | B2 | 1/2005 | Loeppert |
| 6,928,178 | B2 * | 8/2005 | Chang .................... 381/191 |
| 6,987,859 | B2 | 1/2006 | Loeppert et al. |
| 7,023,066 | B2 | 4/2006 | Lee et al. |
| 7,132,307 | B2 | 11/2006 | Wang et al. |
| 7,166,910 | B2 | 1/2007 | Minervini |
| 7,466,834 | B2 * | 12/2008 | Ogura et al. ................ 381/174 |
| 8,155,355 | B2 * | 4/2012 | Ogura et al. ................ 381/174 |
| 2005/0018864 | A1 | 1/2005 | Minervini |
| 2006/0093171 | A1 * | 5/2006 | Zhe et al. .................... 381/191 |
| 2009/0116662 | A1 * | 5/2009 | Wu ............................ 381/94.2 |

OTHER PUBLICATIONS

Karthik Kadirvel, Development of Closed-Loop Interface Circuits for Capacitive Transducers with Application to a MEMS Capacitive Microphone, Ph.D, dissertations, University of Florida, Gainesville, FL, 2007.*

Martin, David T. 2007. Design, Fabrication, Characterization of a MEMS Dual Backplate Capacitive Microphone. [Gainesville, FL]: University of Florida. http://purl.fcla.edu/fcla/etd/UFE0017526. Published Feb. 28, 2008.*

Kadirvel, Karthik. 2007. Development of Closed-Loop Interface Circuits for Capacitive Transducers with Application to a MEMS Capacitive Microphone. [Gainesville, FL]: University of Florida. http://purl.fcla.edu/fcla/etd/UFE0020083. Published Mar. 13, 2008.*

"SIMM '05, Yole Silicon Microphone Market Report 2005 Technolgy and Market Analysis: From Silicon Microphone Device to Mircrophone Modules", Yole Development, Sep. 2005.

P.V. Loeppert and S.B. Lee, "SiSonicTM—The first commercialized MEMS microphone," in *Proceedings of Solid-State Sensor and Actuator Workshop*, Hilton Head Island, SC, 2006, pp. 27-30.

Bustillo, James M., et al., "Surface Micromachining for Microelectromechanical Systems" *Proceedings of the IEEE*, Aug. 1998, pp. 1552-1574, vol. 86, No. 8.

Hietanen, Jarmo, et al., "An integrated Printed Circuit Board (PCB) microphone", *J. Acoust. Soc. Am.*, May 2000, pp. L25-L30.

Gruel & Kjaer, "Technical Documentation: Microphone Handbook", 1996. vol. 1.

* cited by examiner

CAPACITIVE MICROPHONE WITH INTEGRATED CAVITY

CROSS-REFERENCE TO RELATED APPLICATIONS

The present application is the U.S. National Stage Application of International Patent Application No. PCT/US2008/061603, filed Apr. 25, 2008, which claims the benefit of U.S. Application Ser. No. 60/926,307, filed Apr. 25, 2007, both of which are hereby incorporated by reference herein in their entirety, including any figures, tables, or drawings.

BACKGROUND OF INVENTION

Many consumer electronic products incorporate a microphone. As this is a high volume market, average selling price (ASP) is typically a key factor. The "Yole Silicon Microphone Market Report 2005" [1] projects the total silicon microphone market to be 2.75 M units and 221 M$ by 2008 with the major applications being mobile phones, PDAs, laptops, PCs, hearing aids, acoustic noise control and automotive crash detection. Many of these products use conventional electret condenser microphones (ECM) produced by a number of low cost suppliers. To date, one silicon micromachined microphone (Knowles acoustics SiSonic [2]) has been able to compete effectively in this market by meeting the performance, reliability, and price expectations set by the ECM suppliers. Typically, die shrinkage (more parts per wafer) and elimination of processing steps (lower cost per fabrication lot run) can lower the ASP. However, the high costs associated with silicon microfabrication currently limits the microfabrication-based cost cutting measures. The packaging costs of the device can also be a dominant factor. For the SiSonic microphone, the packaging structure includes a base, a wall, and a lid all made from FR4 printed-circuit board (PCB) material and laminated together [2]. This package must be large enough to fit the silicon microphone and amplifier die, as well as the associated passives.

BRIEF SUMMARY OF INVENTION

Figure 1:
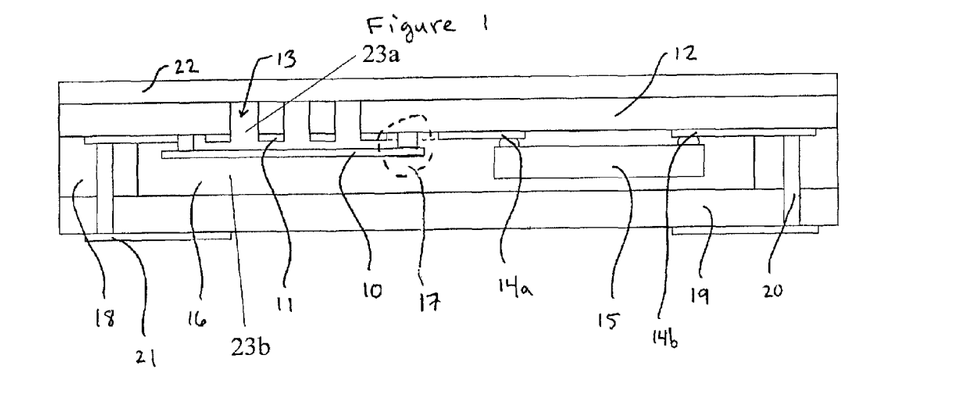
FIG. 1 shows a cross-sectional schematic of a PCB-based capacitive microphone according to an embodiment of the present invention.

Embodiments of the subject invention relate to a method of fabricating a capacitive microphone. Embodiments also pertain to a capacitive microphone. In an embodiment, the subject capacitive microphone can use PCB-fabrication technology to realize a low-cost microphone integrated with the microphone package. FIG. 1 shows a cross-section of a specific embodiment of a capacitive microphone in accordance with the subject invention. The embodiment of FIG. 1 is a condenser microphone in which a surface micromachined diaphragm 10 is separated from a porous backplate 11 on the interior surface of a sheet of a PCB substrate 12. The diaphragm 10 can be positioned on the PCB substrate 12 such that a front surface of the diaphragm can be exposed to air passing through one or more apertures 13 formed in the PCB substrate 12. The microphone in FIG. 1 can also be an electret microphone by placing permanent electric charge on either the back plate or the diaphragm and creating an output signal based on a change in voltage across the back plate and the diaphragm.

Embodiments of the subject capacitive microphone can be condenser or electret condenser. In a specific embodiment fabricated using PCB-based technology, a 24"×24" substrate is utilized, which can save costs for high volume. In an embodiment locating the interface electronics within the cavity, a conductive interior surface on the enclosure top, wall, or bottom can be used to connect the backplate to the interface electronics, and connecting to the diaphragm, such that no wire bonds are needed. Reducing the need for wire bonds can reduce costs and improve reliability. In an embodiment, the exterior of the package can be metal-plated and grounded to shield against electromagnetic interference. In accordance with various embodiments of the invention, lower fabrication cost and an integrated package can allow the microphone diaphragm to be much larger. The larger diaphragm can improve sensitivity, increase the sensor capacitance, and reduce the noise floor, resulting in superior performance. Embodiments of the invention can incorporate a large back volume such that the microphone can reduce cavity stiffening effects with respect to silicon devices that are limited to a silicon wafer thickness resulting in improved device performance.

DETAILED DISCLOSURE

Embodiments of the subject invention relate to a method of fabricating a capacitive microphone. Embodiments also pertain to a capacitive microphone. In an embodiment, the subject capacitive microphone can use PCB-fabrication technology to realize a low-cost microphone integrated with the microphone package. FIG. 1 shows a cross-section of a specific embodiment of a capacitive microphone in accordance with the subject invention. The embodiment of FIG. 1 is a condenser microphone in which a surface micromachined diaphragm 10 is separated from a porous backplate 11 on the interior surface of a sheet of a PCB substrate 12. The diaphragm 10 can be positioned on the PCB substrate 12 such that a front surface of the diaphragm, in contact with portion 23a of cavity 16, can be exposed to air passing through one or more apertures 13 formed in the PCB substrate 12 such that portion 23a is in low acoustic impedance with the ambient acoustic environment outside of the device. The microphone in FIG. 1 can also be an electret microphone by placing permanent electric charge on either the back plate or the diaphragm and creating an output signal based on a change in voltage across the back plate and the diaphragm.

Referring to FIG. 1, the two terminals 14a and 14b of the condenser are attached to the appropriate surface mounted interface electronics 15 (i.e., charge pump, buffer amplifier, etc.) via PCB leads. The interface electronics 15 can be located interior to the PCB package microphone. In a specific embodiment, a capillary vent hole can be created through the package, e.g., through the top or sides, to allow air to flow in and out of the portion of the cavity 16 in contact with the surface of diaphragm 10 opposite the surface of the diaphragm 10 toward the one or more apertures 13, in order to equilibrate pressure within the cavity 16. The vent allows portion 23b of cavity 16 to be in high acoustic impedance contact with the ambient acoustic environment outside of the device. In an alternative embodiment, venting can be accomplished via apertures in region 17 or, for embodiments utilizing an insulating spacer between the conductive material connected to the backplate 11 and the diaphragm 10, the apertures can be in the insulating spacer. Such venting can be provided so as to allow a meaningful signal response below about 10 Hz by maintaining cavity in high acoustic impedance contact with the ambient acoustic environment. A middle PCB layer 18 can be hollowed out to form a spacer layer between the top PCB layer 12 and bottom PCB layer 19, such that a cavity 16 is formed. The PCB layers 18 and 19 can include standard conductive vias 20 to the backside of the bottom PCB 19 and appropriate solder bumps and/or leads 21 to enable bump-bond/re-flow assembly.

An optional dust cover 22 can be provided over the one or more apertures 13. The dust cover 22 can be in the form of a protective mesh. In a specific embodiment, the dust cover 22 can be a felt top.

Figure 2:
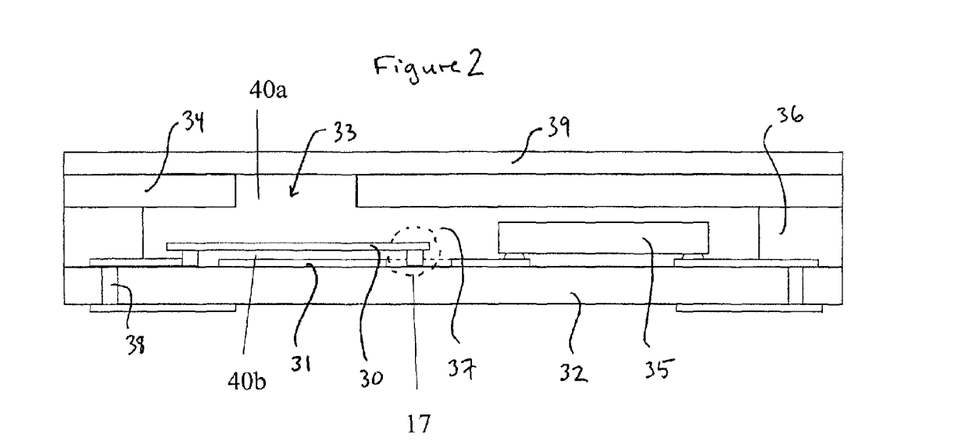
FIG. 2 shows a cross-sectional schematic of a PCB-based capacitive microphone according to an embodiment of the present invention.

FIG. 2 shows a cross-section of another specific embodiment of a capacitive microphone in accordance with the subject invention. The embodiment of FIG. 2 is a condenser microphone in which a diaphragm 30 is separated from a back plate 31 on the interior surface of a sheet of a PCB substrate 32 such that a back surface of the diaphragm 30, in contact with portion 40a of cavity 37, can be exposed to air passing through one or more apertures 33 formed in another PCB substrate 34, such that portion 40a of cavity 37 is in low acoustic impedance with the ambient acoustic environment outside of the device. A front surface of the diaphragm 30 is in contact with portion 40b of cavity 37 between diaphragm 30 and back plate 31, which is in high acoustic impedance with the ambient acoustic environment. Interface electronics 35 can be mounted on the PCB substrate 32. The interface electronics 35 can be located interior to the PCB package microphone. In one embodiment, a middle PCB layer 36 can be hollowed out to form a spacer layer between the top PCB layer 34 and bottom PCB layer 32, such that a cavity 37 is formed. The PCB layer 32 can include standard conductive vias 38 to the backside of the bottom PCB 32. In a further embodiment, an optional dust cover 39 can be provided over the one or more apertures 33. The microphone of FIG. 2 can also be an electret microphone by placing permanent electric charge on either the back plate or the diaphragm and creating an output signal based on a change in voltage across the back plate and the diaphragm.

Embodiments of the subject capacitive microphone can be condenser or electret condenser. In a specific embodiment fabricated using PCB-based technology, a 24"×24" substrate is utilized, which can save costs for high volume. In an embodiment locating the interface electronics within the cavity, a conductive interior surface on the enclosure top, wall, or bottom can be used to connect the backplate to the interface electronics, and connecting to the diaphragm, such that no wire bonds are needed. Reducing the need for wire bonds can reduce costs and improve reliability. In an embodiment, the exterior of the package can be metal-plated and grounded to shield against electromagnetic interference. In accordance with various embodiments of the invention, lower fabrication cost and an integrated package can allow the microphone diaphragm to be much larger. The larger diaphragm can improve sensitivity, increase the sensor capacitance, and reduce the noise floor, resulting in superior performance Embodiments of the invention can incorporate a large back volume such that the microphone can reduce cavity stiffening effects with respect to silicon devices that are limited to a silicon wafer thickness resulting in improved device performance.

In a condenser embodiment of the subject microphone, the microphone can withstand higher operating temperatures and can withstand lead-free solder re-flow cycles (e.g., around 400° C.), which is a product assembly advantage over ECMs. The enclosure of various embodiments of the invention can use a variety of materials, including as examples printed circuit board (PCB) or printed wiring board (PWB). PCB and PWB technology refer to modern circuit board construction. These boards can include multiple laminated dielectric and conductive layers. The dielectric layer can serve as the structural support. FR4 (flame-retardant 4) can be used as the dielectric layer in the boards. Other options include, but are not limited to, FR2, polyimide (for flexible circuits), Getek, Thermount, and Rogers 4050, Rogers 4003 (RF circuits), etc. The conductive layers (e.g., copper or other metal) can be etched or "patterned" to provide discrete electrical connections between various regions of the board.

Figure 3:
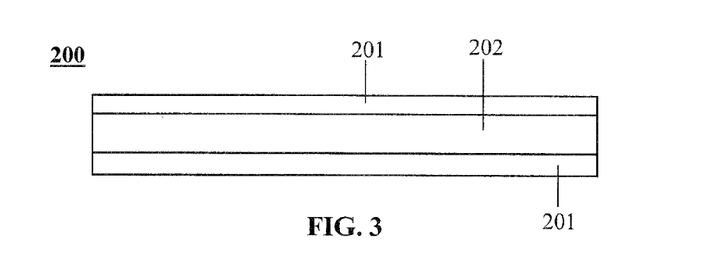
FIG. 3 shows a cross-sectional representation of a PCB board according to an embodiment of the present invention.
Figure 4A:
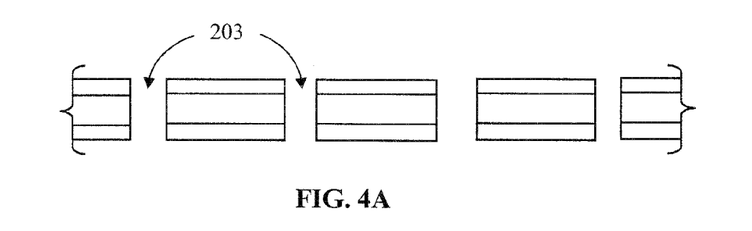
FIGS. 4A and 4B show a cross-sectional view and top view, respectively, of drilled holes fabricated according to an embodiment of the present invention.
Figure 4B:
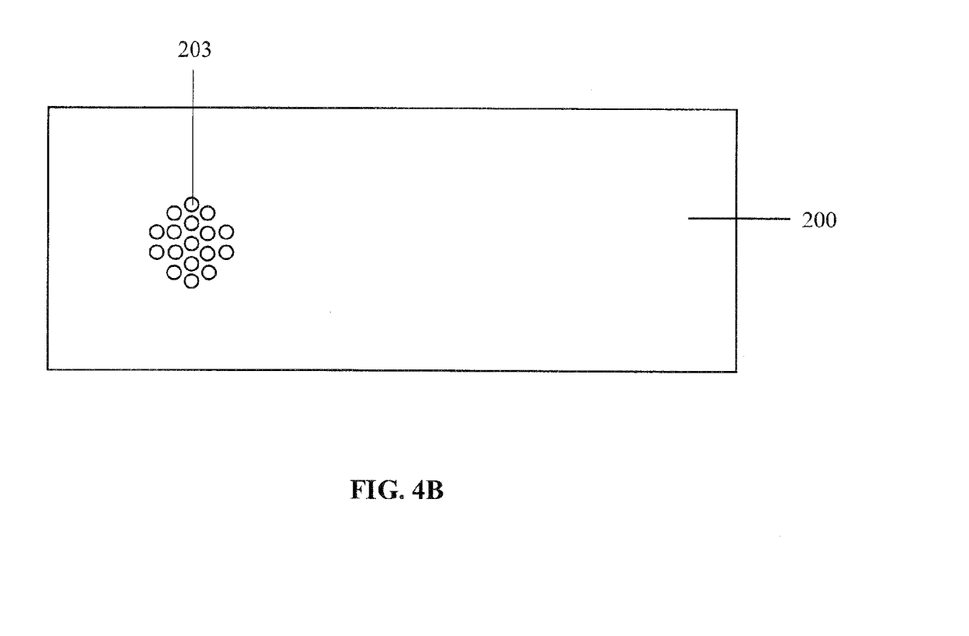

In an embodiment, surface-micromachining can be used to form a microphone directly on the board substrate forming a portion of the enclosure. Referring to FIG. 3, a first step can involve selecting a PCB 200 having an outer conductor layer 201 on one or both exterior surfaces and one or more dielectric layers 202 in the middle. The dielectric layer(s) 202 can be fiber glass and the conductor layer 201 can be a metal. Referring to FIGS. 4A and 4B, where FIG. 4A shows a cross-sectional view and FIG. 4B shows a top view, one or more apertures 203 can be created through the PCB board 200 to allow air to travel through the PCB. In one embodiment, the one or more apertures 203 can be formed by drilling into the PCB 200. Other techniques for creating the apertures can also be used. In a variety of embodiments, the position, shape and pattern of the one or more apertures 203 can be formed as desired.

Figure 5A:
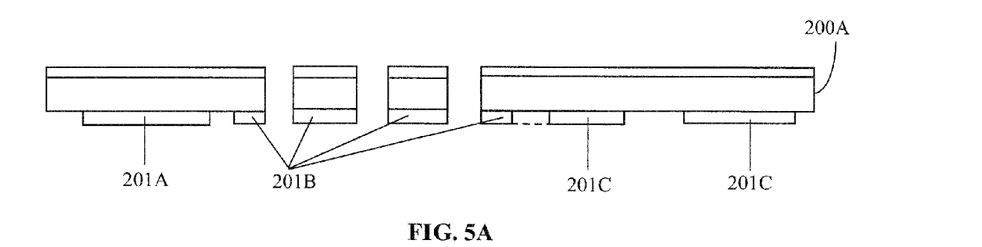
FIGS. 5A-5D show cross-sectional schematics illustrating a method of fabricating a microphone according to an embodiment of the present invention.

In one embodiment, patterns can be etched in the outer conductor layer(s) 201 of the PCB board 200 in preparation of interconnecting the electronics of the microphone. FIG. 5A shows a specific embodiment of a PCB 200A having patterns etched into the conductor layer at one surface of the PCB 200A. The patterns can include diaphragm lead lines 201A, a backplate pattern 201B, and interface electronics lead lines 201C.

Figure 5B:
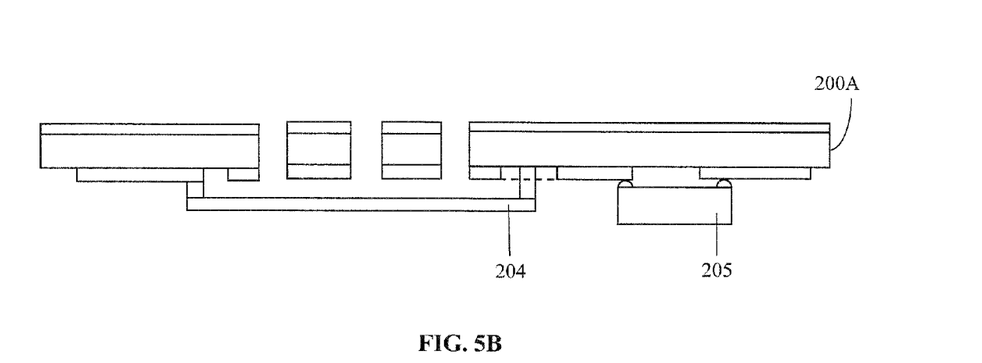
Figure 5C:
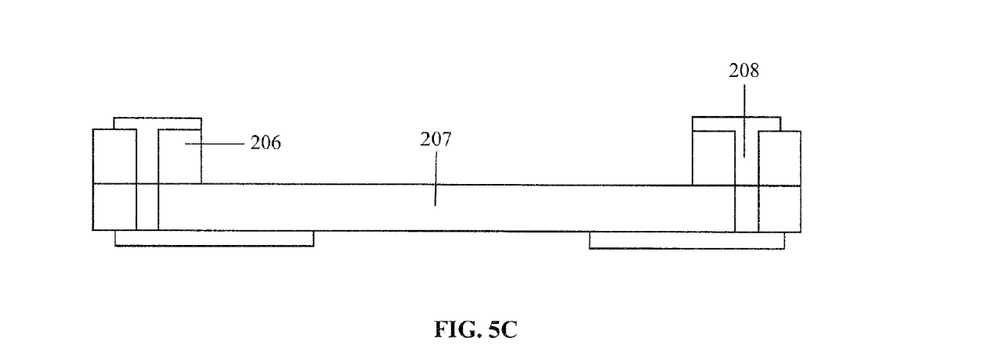
Figure 5D:
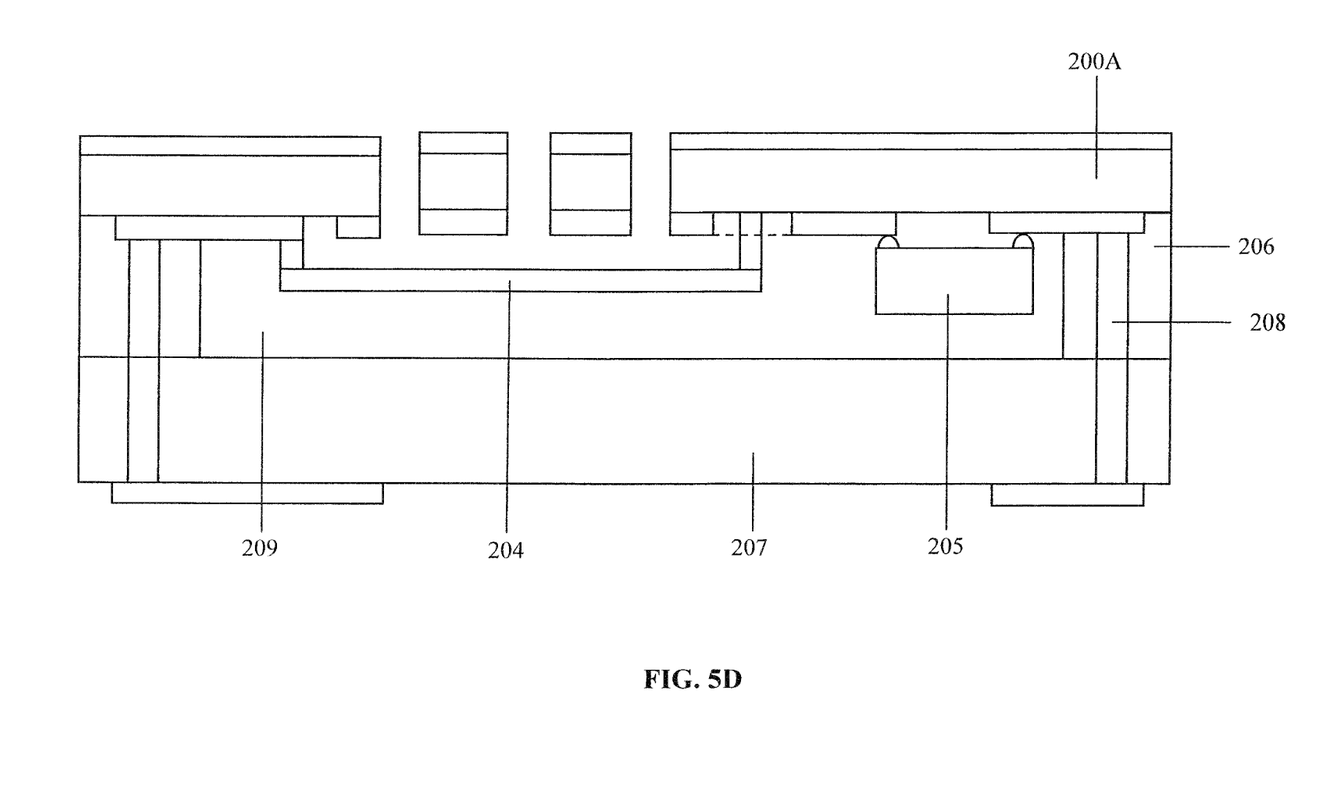

Referring to FIG. 5B, a diaphragm 204 can then be surface micromachined onto the interior surface of the PCB 200A. In addition, the interface electronics 205, which can be provided in the form of an Application Specific Integrated Circuit (ASIC), can be interconnected to the interior surface of the PCB 200A either before or after micromachining the diaphragm 204 onto the PCB surface. Referring to FIG. 5C, one or more spacer PCBs 206 can be attached to a bottom PCB 207, or to the top PCB 200A, such that appropriate interconnections between interconnect vias 208 are made. Referring to FIG. 5D, the bottom PCB 207 and top PCB 200 with spacers 206 in between can be attached so as to create a cavity 209 in which the diaphragm 204 and ASIC interface electronics 205 are positioned. It is understood that other techniques can be used to create the cavity.

Figure 6A:
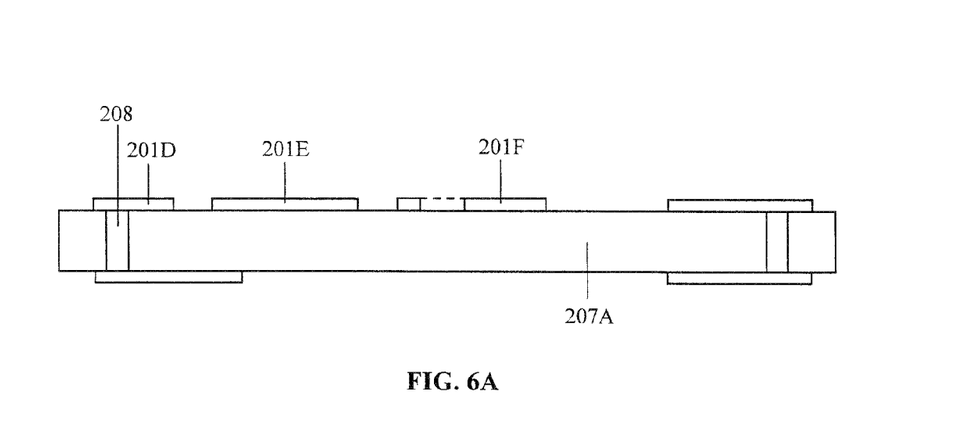
FIGS. 6A-6C show cross-sectional schematics illustrating a method of fabrication a microphone according to an embodiment of the present invention.
Figure 6B:
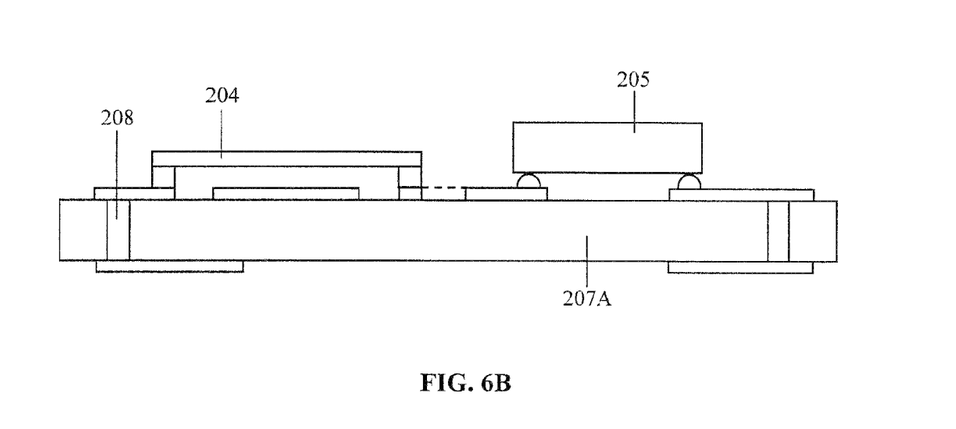
Figure 6C:
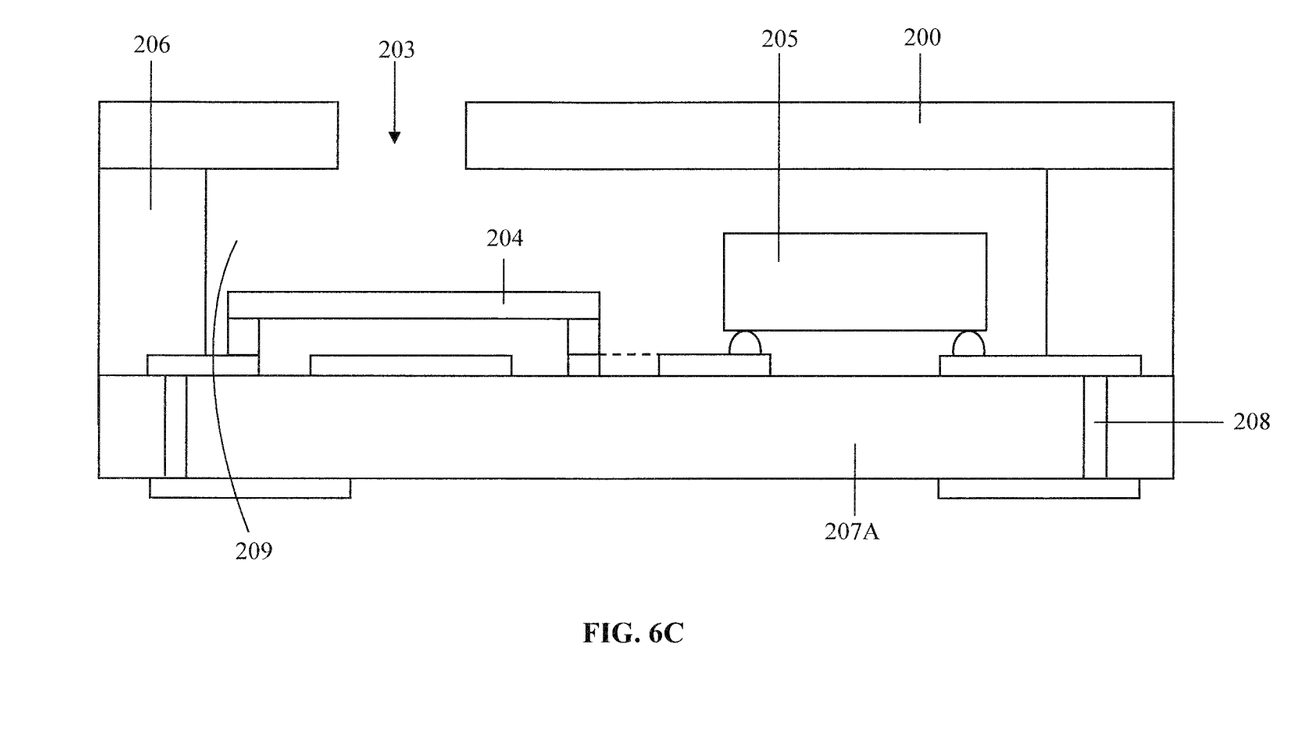

In another embodiment as illustrated in FIGS. 6A-6C, a diaphragm can be located on a second PCB that is not provided with one or more apertures. Referring to FIG. 6A, patterns can be etched in the outer conductor layer(s) of a PCB substrate 207A in preparation of interconnecting the electronics of the microphone. The patterns can include diaphragm lead lines 201D, a backplate pattern 201E, and interface electronics lead lines 201F. Interconnect vias can be formed in the PCB substrate 207A to provide electrical connections to the outside.

Referring to FIG. 6B, a diaphragm 204 can then be surface micromachined onto the interior surface of the PCB 207A. In addition, the interface electronics 205, which can be provided in the form of an Application Specific Integrated Circuit (ASIC), can be interconnected to the interior surface of the PCB 207A either before or after micromachining the diaphragm 204 onto the PCB surface. Referring to FIG. 6C, one or more spacer PCBs 206 can be attached to the PCB 207A or to a top PCB 200 having one or more apertures 203. Then, the bottom PCB 207A and top PCB 200 with spacers 206 in between can be attached so as to create a cavity 209 in which the diaphragm 204 and ASIC interface electronics 205 are positioned. It is understood that other techniques can also be used to create the cavity.

When constructing a complete package with the ASIC interface electronics and, optionally other components embedded, the system can be a multi-chip module (MCM), where MCM technology refers to assembling one or more devices, chips, or components on a common substrate to form a more complex system. MCMs can be further classified by the supporting technology used to form the electrical interconnections on the substrate. Embodiments of the invention can utilize MCM-L, MCM-D, and/or MCM-C, where MCM-L (laminated MCM) involves a base substrate that is a multi-layer laminated PCB, MCM-D (deposited MCM) involves a base substrate that is often a semiconductor wafer with films deposited using thin film deposition techniques, and MCM-C (ceramic substrate MCM) involves a base substrate that is laminated ceramic board, (e.g. low-temperature co-fired ceramic (LTCC)) most often used for RF circuits.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

REFERENCES

[1] "SIMM '05, Yole Silicon Microphone Market Report 2005 Technology and Market Analysis: From Silicon Microphone Device to Microphone Modules", Yole Development, September 2005.

[2] P. V. Loeppert and S. B. Lee, "SiSonic™—The first commercialized MEMS microphone," in *Proceedings of Solid-State Sensor and Actuator Workshop*, Hilton Head Island, S.C., 2006, pp. 27-30.

The invention claimed is:

1. A microphone, comprising:
a back plate deposited on a portion of a first printed circuit board;
a diaphragm positioned relative to the portion of the first printed circuit board so as to form a first volume between the diaphragm and the back plate, wherein a front surface of the diaphragm is in contact with the first volume, wherein a back surface of the diaphragm is in contact with a second volume, wherein one of the first volume and the second volume is in low acoustic impedance contact with the ambient acoustic environment and the other of the first volume and the second volume is in high acoustical impedance contact with the ambient acoustic environment, wherein when the diaphragm flexes in response to acoustic pressure, an output signal related to the acoustic pressure on the diaphragm is produced; and
an enclosure, wherein the second volume is within the enclosure;
wherein the first volume is in low acoustic impedance contact with the ambient acoustic environment and the second volume is in high acoustic impedance contact with the ambient acoustic environment; and
wherein the enclosure comprises:
the first printed circuit board;
a second printed circuit board; and
one or more spacer printed circuit boards, wherein the first printed circuit board, the one or more spacer printed circuit boards, and the second printed circuit board are attached to form the enclosure,
wherein the diaphragm is within the enclosure.

2. The microphone according to claim 1, wherein the diaphragm comprises a conducting material, wherein the back plate comprises a conducting material, wherein when a bias voltage is applied between the diaphragm and the back plate, flexing of the diaphragm causes a change in electric charge across the diaphragm and the back plate, wherein the output signal is produced from the change in electric charge across the diaphragm and the back plate.

3. The microphone according to claim 2, further comprising a means for applying a bias voltage between the back plate and the diaphragm.

4. The microphone according to claim 3, wherein the means for applying a bias voltage between the back plate and the diaphragm comprises interface electronics.

5. The microphone according to claim 3, further comprising an electrical impedance buffer amplifier that produces the output signal related to the acoustic pressure on the diaphragm.

6. The microphone according to claim 5, wherein the output signal related to the acoustic pressure on the diaphragm is a low impedance output signal.

7. The microphone according to claim 1, wherein the diaphragm comprises a permanent electric charge, wherein the back plate comprises a conducting material, wherein flexing of the diaphragm causes a voltage change across the diaphragm and the back plate, wherein the output signal is produced from the voltage change across the diaphragm and the back plate.

8. The microphone according to claim 1, wherein the diaphragm comprises a conducting material, wherein the back plate comprises a permanent electric charge, wherein flexing of the diaphragm causes a voltage change across the diaphragm and the back plate, wherein the output signal is produced from the voltage change across the diaphragm and the back plate.

9. The microphone according to claim 1, wherein the second volume is formed by the first printed circuit board, the diaphragm, the one or more spacer printed circuit boards, and the second printed circuit board.

10. The microphone according to claim 1, further comprising one or more apertures through the first printed circuit board that allow acoustic waves to pass through the one or more apertures from the ambient acoustic environment into the first volume and from the first volume to the ambient acoustic environment.

11. The microphone according to claim 1, wherein the diaphragm is micromachined on the first printed circuit board.

12. The microphone according to claim 11, wherein the diaphragm is grown or deposited onto the first printed circuit board.

13. The microphone according to claim 1, wherein the diaphragm is placed on the first printed circuit board.

14. The microphone according to claim 1,
further comprising a vent passing through the enclosure that allows ambient fluid to pass back and forth between the second volume and the ambient acoustic environment while maintaining the second volume in high acoustic impedance with the ambient acoustic environment.

15. The microphone according to claim 14, wherein the ambient fluid is air.

16. The microphone according to claim 1, further comprising:
a vent to allow ambient fluid to pass back and forth between the first volume and the second volume while maintaining the second volume in high acoustic impedance with the ambient acoustic environment.

17. The microphone according to claim 16, wherein the ambient fluid is air.

18. A method of fabricating a microphone, comprising:
depositing a back plate on a portion of a first printed circuit board;
locating a diaphragm relative to the portion of the first printed circuit board so as to form a first volume between the diaphragm and the back plate, wherein a front surface of the diaphragm is in contact with the first volume, wherein a back surface is in contact with a second volume, wherein one of the first volume and the second volume is in low acoustic impedance contact with the ambient acoustic environment, and the other of the first volume and second volume is in high acoustical impedance contact with the ambient acoustic environment, wherein the diaphragm flexes in response to acoustic pressure;
producing output signal related to the acoustic pressure on the diaphragm,
wherein the first volume is in low acoustic impedance contact with the ambient acoustic environment and the second volume is in high acoustic impedance contact with the ambient acoustic environment,
further comprising:
providing an enclosure, wherein the second volume is within the enclosure,
wherein the enclosure comprises:
the first printed circuit board;
a second printed circuit board;
one or more spacer printed circuit boards, wherein the first printed circuit board, the one or more spacer printed circuit boards, and the second printed circuit board are attached to form the enclosure.

19. The method according to claim 18, wherein providing the back plate on the portion of the printed circuit board comprises patterning a conductive layer of the printed circuit board.

20. The method according to claim 18, wherein the diaphragm comprises a conducting material, wherein the back plate comprises a conducting material, further comprising:
a bias voltage between the diaphragm and the back plate, wherein flexing of the diaphragm causes a change in electric charge across the diaphragm and the back plate, wherein the output signal is produced from the change in electric charge across the diaphragm and the back plate.

21. The method according to claim 20, further comprising applying a bias voltage between the back plate and the diaphragm.

22. The method according to claim 21, wherein applying a bias voltage between the back plate and the diaphragm comprises applying a bias voltage via interface electronics.

23. The method according to claim 21, further comprising producing the output signal via an electrical impedance buffer amplifier.

24. The method according to claim 23, wherein the output signal related to the acoustic pressure on the diaphragm is a low impedance output signal.

25. The method according to claim 18, wherein the diaphragm comprises a permanent electric charge, wherein the back plate comprises a conducting material, wherein flexing of the diaphragm causes a voltage change across the diaphragm and the back plate, wherein the output signal is produced from the voltage change across the diaphragm and the back plate.

26. The method according to claim 18, wherein the diaphragm comprises a conducting material, wherein the back plate comprises a permanent electric charge, wherein flexing of the diaphragm causes a voltage change across the diaphragm and the back plate, wherein the output signal is produced from the voltage change across the diaphragm and the back plate.

27. The method according to claim 18, wherein the diaphragm is within the enclosure.

28. The method according to claim 18, wherein the second volume is formed by the first printed circuit board, the diaphragm, the one or more spacer printed circuit boards, and the second printed circuit board.

29. The method according to claim 18, further comprising creating one or more apertures through the first printed circuit board that allow acoustic waves to pass through the one or more apertures from the ambient acoustic environment into the first volume and from the first volume to the ambient acoustic environment.

30. The method according to claim 18, wherein the diaphragm is micromachined on the first printed circuit board.

31. The method according to claim 30, wherein the diaphragm is grown or deposited onto the first printed circuit board.

32. The method according to claim 18, wherein the diaphragm is placed on the first printed circuit board.

33. The method according to claim 18,
further comprising providing a vent passing through the enclosure that allows ambient fluid to pass back and forth between the second volume and the ambient acoustic environment while maintaining the second volume in high acoustic impedance with the ambient acoustic environment.

34. The method according to claim 33, wherein the ambient fluid is air.

35. The method according to claim 18, further comprising:
providing a vent to allow ambient fluid to pass back and forth between the first volume and the second volume while maintaining the second volume in high acoustic impedance with the ambient acoustic environment.

36. The method according to claim 35, wherein the ambient fluid is air.

37. A microphone, comprising:
a back plate fabricated on a portion of a first printed circuit board;

a diaphragm positioned relative to the portion of the first printed circuit board so as to form a first volume between the diaphragm and the back plate, wherein a front surface of the diaphragm is in contact with the first volume, wherein a back surface of the diaphragm is in contact with a second volume, wherein one of the first volume and the second volume is in low acoustic impedance contact with the ambient acoustic environment and the other of the first volume and the second volume is in high acoustical impedance contact with the ambient acoustic environment, wherein when the diaphragm flexes in response to acoustic pressure, an output signal related to the acoustic pressure on the diaphragm is produced; and an enclosure, wherein the second volume is within the enclosure;

wherein the first volume is in low acoustic impedance contact with the ambient acoustic environment and the second volume is in high acoustic impedance contact with the ambient acoustic environment; and wherein the enclosure comprises:
the first printed circuit board;
a second printed circuit board; and
one or more spacer printed circuit boards, wherein the first printed circuit board, the one or more spacer printed circuit boards, and the second printed circuit board are attached to form the enclosure,
wherein the diaphragm is within the enclosure.

38. The microphone according to claim 37, wherein the diaphragm comprises a conducting material, wherein the back plate comprises a conducting material, wherein when a bias voltage is applied between the diaphragm and the back plate, flexing of the diaphragm causes a change in electric charge across the diaphragm and the back plate, wherein the output signal is produced from the change in electric charge across the diaphragm and the back plate.

39. The microphone according to claim 38, further comprising a means for applying a bias voltage between the back plate and the diaphragm.

40. The microphone according to claim 39, wherein the means for applying a bias voltage between the back plate and the diaphragm comprises interface electronics.

41. The microphone according to claim 39, further comprising an electrical impedance buffer amplifier that produces the output signal related to the acoustic pressure on the diaphragm.

42. The microphone according to claim 41, wherein the output signal related to the acoustic pressure on the diaphragm is a low impedance output signal.

43. The microphone according to claim 37, wherein the diaphragm comprises a permanent electric charge, wherein the back plate comprises a conducting material, wherein flexing of the diaphragm causes a voltage change across the diaphragm and the back plate, wherein the output signal is produced from the voltage change across the diaphragm and the back plate.

44. The microphone according to claim 37, wherein the diaphragm comprises a conducting material, wherein the back plate comprises a permanent electric charge, wherein flexing of the diaphragm causes a voltage change across the diaphragm and the back plate, wherein the output signal is produced from the voltage change across the diaphragm and the back plate.

45. The microphone according to claim 37, wherein the second volume is formed by the first printed circuit board, the diaphragm, the one or more spacer printed circuit boards, and the second printed circuit board.

46. The microphone according to claim 37, further comprising one or more apertures through the first printed circuit board that allow acoustic waves to pass through the one or more apertures from the ambient acoustic environment into the first volume and from the first volume to the ambient acoustic environment.

47. The microphone according to claim 37, wherein the diaphragm is micromachined on the first printed circuit board.

48. The microphone according to claim 47, wherein the diaphragm is grown or deposited onto the first printed circuit board.

49. The microphone according to claim 37, wherein the diaphragm is placed on the first printed circuit board.

50. The microphone according to claim 37,
further comprising a vent passing through the enclosure that allows ambient fluid to pass back and forth between the second volume and the ambient acoustic environment while maintaining the second volume in high acoustic impedance with the ambient acoustic environment.

51. The microphone according to claim 50, wherein the ambient fluid is air.

52. The microphone according to claim 37, further comprising:
a vent to allow ambient fluid to pass back and forth between the first volume and the second volume while maintaining the second volume in high acoustic impedance with the ambient acoustic environment.

53. The microphone according to claim 52, wherein the ambient fluid is air.

54. A method of fabricating a microphone, comprising:
fabricating a back plate on a portion of a first printed circuit board;
locating a diaphragm relative to the portion of the first printed circuit board so as to form a first volume between the diaphragm and the back plate, wherein a front surface of the diaphragm is in contact with the first volume, wherein a back surface is in contact with a second volume, wherein one of the first volume and the second volume is in low acoustic impedance contact with the ambient acoustic environment, and the other of the first volume and second volume is in high acoustical impedance contact with the ambient acoustic environment, wherein the diaphragm flexes in response to acoustic pressure; and
producing an output signal related to the acoustic pressure on the diaphragm,
wherein the first volume is in low acoustic impedance contact with the ambient acoustic environment and the second volume is in high acoustic impedance contact with the ambient acoustic environment,
further comprising:
providing an enclosure, wherein the second volume is within the enclosure,
wherein the enclosure comprises:
the first printed circuit board;
a second printed circuit board;
one or more spacer printed circuit boards, wherein the first printed circuit board, the one or more spacer printed circuit boards, and the second printed circuit board are attached to form the enclosure.

55. The method according to claim 54, wherein providing the back plate on the portion of the printed circuit board comprises patterning a conductive layer of the printed circuit board.

56. The method according to claim 54, wherein the diaphragm comprises a conducting material, wherein the back plate comprises a conducting material, further comprising:
- a bias voltage between the diaphragm and the back plate, wherein flexing of the diaphragm causes a change in electric charge across the diaphragm and the back plate, wherein the output signal is produced from the change in electric charge across the diaphragm and the back plate.

57. The method according to claim 56, further comprising applying a bias voltage between the back plate and the diaphragm.

58. The method according to claim 57, wherein applying a bias voltage between the back plate and the diaphragm comprises applying a bias voltage via interface electronics.

59. The method according to claim 57, further comprising producing the output signal via an electrical impedance buffer amplifier.

60. The method according to claim 59, wherein the output signal related to the acoustic pressure on the diaphragm is a low impedance output signal.

61. The method according to claim 54, wherein the diaphragm comprises a permanent electric charge, wherein the back plate comprises a conducting material, wherein flexing of the diaphragm causes a voltage change across the diaphragm and the back plate, wherein the output signal is produced from the voltage change across the diaphragm and the back plate.

62. The method according to claim 54, wherein the diaphragm comprises a conducting material, wherein the back plate comprises a permanent electric charge, wherein flexing of the diaphragm causes a voltage change across the diaphragm and the back plate, wherein the output signal is produced from the voltage change across the diaphragm and the back plate.

63. The method according to claim 54, wherein the diaphragm is within the enclosure.

64. The method according to claim 54, wherein the second volume is formed by the first printed circuit board, the diaphragm, the one or more spacer printed circuit boards, and the second printed circuit board.

65. The method according to claim 54, further comprising creating one or more apertures through the first printed circuit board that allow acoustic waves to pass through the one or more apertures from the ambient acoustic environment into the first volume and from the first volume to the ambient acoustic environment.

66. The method according to claim 54, wherein the diaphragm is micromachined on the first printed circuit board.

67. The method according to claim 66, wherein the diaphragm is grown or deposited onto the first printed circuit board.

68. The method according to claim 54, wherein the diaphragm is placed on the first printed circuit board.

69. The method according to claim 54,
- further comprising providing a vent passing through the enclosure that allows ambient fluid to pass back and forth between the second volume and the ambient acoustic environment while maintaining the second volume in high acoustic impedance with the ambient acoustic environment.

70. The method according to claim 69, wherein the ambient fluid is air.

71. The method according to claim 54, further comprising:
- providing a vent to allow ambient fluid to pass back and forth between the first volume and the second volume while maintaining the second volume in high acoustic impedance with the ambient acoustic environment.

72. The method according to claim 71, wherein the ambient fluid is air.

* * * * *

UNITED STATES PATENT AND TRADEMARK OFFICE
CERTIFICATE OF CORRECTION

PATENT NO. : 8,705,775 B2  Page 1 of 1
APPLICATION NO. : 12/597572
DATED : April 22, 2014
INVENTOR(S) : Sheplak et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 797 days.

Signed and Sealed this
Twenty-ninth Day of September, 2015

Michelle K. Lee
*Director of the United States Patent and Trademark Office*